United States Patent [19]

Figge

[11] Patent Number: 5,314,342

[45] Date of Patent: May 24, 1994

[54] UNIVERSAL PROBE ADAPTER

[75] Inventor: Timothy A. Figge, Colorado Springs, Colo.

[73] Assignee: Hewlett-Packard Company, Palo Alto, Calif.

[21] Appl. No.: 944,153

[22] Filed: Sep. 9, 1992

[51] Int. Cl.⁵ .................... H01R 9/09; H01R 43/04
[52] U.S. Cl. ........................... 439/66; 439/67; 439/912; 29/747; 29/750
[58] Field of Search ............... 29/874, 876, 884, 882, 29/747, 750, 751, 759, 760, 761; 439/66, 67, 68, 71, 912, 912.1

[56] References Cited

U.S. PATENT DOCUMENTS

| | | |
|---|---|---|
| 4,479,301 | 10/1984 | Resch .................... 29/751 |
| 4,689,556 | 8/1987 | Cedrone .............. 439/912.1 X |
| 4,695,258 | 9/1987 | Hanson et al. ............ 439/67 |
| 5,057,023 | 10/1991 | Kabadi et al. ............ 439/67 |
| 5,171,290 | 12/1992 | Olla et al. .............. 439/71 |

Primary Examiner—Timothy V. Eley
Assistant Examiner—Khan V. Nguyen

[57] ABSTRACT

The invention provides an adapter for electrically connecting an electronic probe to an electronic device. A pair of jaws are slidably mounted on rails. Teeth protrude from the jaws in a position to engage the gaps between the leads of a fine pitch integrated circuit chip. A flex circuit has traces connecting exposed contacts on one end, which exposed contacts are located between the teeth. The contacts have the same pitch as the chip leads. A wire-filled elastomer is located over the exposed contacts. A screw passing through threaded bores in the jaws, draws the jaws toward each other, urging the teeth into the gaps to self-align the adapter, and compressing the elastomer, so that the wires in it connect each chip lead to one of the exposed contacts. A probe may be connected to a selected lead by connecting it to the appropriate through-hole.

13 Claims, 9 Drawing Sheets

UNIVERSAL PROBE ADAPTER

BACKGROUND OF THE INVENTION

1. Field of the Invention

The invention in general relates to electronic probe adapters, and more particularly to a probe adapter that adjusts to fit a variety of integrated circuit chips.

2. Statement of the Problem

To test electronic parts, such as integrated circuits, an electronic probe must be electrically connected to their leads. One common way of making the electrical connection is by manual probing. In manual probing the user holds a narrow-tipped electronic probe by hand and attempts to put the tip of the probe on the lead which carries the signal to be examined. As leads have become narrower and the spaces between them very small, holding a single point probe by hand accurately and steady enough to make an electronic measurement has become difficult. With current surface mount technology having leads less than 0.01 inches wide and having a pitch of less than 0.05 inches, manual probing is nearly impossible.

One solution to the problem of manual probing of fine pitch surface mount components has been to develop a probe adapter for each surface mount component package on the market. That is, an adapter is created which is of the precise size and shape to receive the leads of a specific integrated circuit package, and which provides terminals electrically connected to each lead, which terminals are relatively widely spaced and accessible to a probe. These package-specific adapters work well, but a user that is not able to anticipate the specific surface mount package that he or she will need to probe either has to wait days, weeks, or even months while the appropriate adapter is ordered and delivered, devise a jury-rigged adapter, or must resort to manual methods. A user could take the approach of purchasing every adapter he or she is likely to need. However, since a single adapter can cost $200 or more, this can become expensive. This solution also can be confusing to use, and bulky to carry for remote applications.

Another solution has been the use of a miniature hook or set of hooks which wrap around a lead and can be pulled up tight to make electrical contact. This solution was originally designed for through-hole components, but has been extended to other leads, particularly in emergencies. However, the requirement of hooking and wrapping around each lead has also become difficult as pitches of leads on chips has become finer. Typically the spaces for the probe to hook and wrap around a lead are less than 0.015 inches on fine pitch surface mount components. This small gap requires the hook material to be thin and fragile. Further, there is a danger of shorting the lead to be tested to the adjacent lead.

Another method that is not commercially sold but is certainly practiced is to solder a conductor to the lead or trace to be tested, then hook an existing probe to the soldered-in conductor. This procedure requires a soldering iron to be available and is very time consuming. Further, soldering near fine pitch surface mount components is risky since leads can be unknowingly shorted together.

None of the solutions to connecting to fine pitch leads is satisfactory for the typical electronics specialist who must routinely test a variety of electronic components. Thus there is a need for a fine pitch probe adapter that permits accurate, reliable, and quick connection of a probe to a wide variety of integrated circuit components having fine pitch leads.

3. Solution to the Problem

The invention solves the above problems by providing a probe adapter that adjusts to many, if not all, surface mount integrated circuit packages as well as many other integrated circuit devices.

The invention provides an adapter that easily connects the leads on an integrated circuit package of any width to a set of connecting terminals to which a probe is easily attached. The connections are made via an elastomer pad in which thousands of tiny wires are embedded.

The invention provides a device for clamping the elastomer pad between the leads of the electronic device and a set of contacts that connect to the connecting terminals. The set of contacts is preferably a set of exposed traces on one end a flex circuit. The other end of the flex circuit extends from the clamping device and contains the connecting terminals. The flex circuit is chosen so the exposed traces have the same pitch as the leads on the electronic device. Flex circuits of different pitches may be inserted into the clamping device.

The clamping device is preferably a vise-like framework having a pair of jaws that are screwed, ratcheted, or otherwise urged toward each other to clamp the adapter to the electronic device. Each of the jaws has one or more teeth that fit in the gaps between the leads of the electronic device to align the exposed traces on the flex circuit with the leads. The teeth are tapered so that as the jaws are urged toward each other, the teeth self-align between the leads, thereby aligning the exposed traces and the leads.

Each of the jaws has a pocket for locating and holding the elastomer so that as the adapter is clamped to the electronic device, the elastomer is compressed and the wires embedded in it make contact between the leads and the contacts of the flex circuit.

As indicated above, each of the contacts of the flex circuit connects to an electrical terminal. The terminals are preferably conductive through-holes into which the pin of a probe may be inserted, but may be any suitable connector.

The probe adapter is used by opening the jaws wider than the fine pitch electronic device to be tested. The jaws are aligned over the leads to be tested, with the teeth roughly in gaps between the leads, then forced toward each other to urge the teeth into the gaps between the leads and compress the wire-containing elastomer between the leads and the flex circuit contacts. When the adapter is clamped to the electronic device, a test instrument probe is connected to the terminals of the flex circuit.

SUMMARY OF THE INVENTION

The invention provides a probe adapter for making electrical connection between an electronic probe and leads of an electronic device, the probe adapter comprising: probe connection means comprising a plurality of contacts and means for connecting the contacts to the probe; a connecting member comprising a plurality of conductors and non-conducting support means for supporting the conductors aligned in a selected direction; means for compressing the connecting member between the contacts and the leads so that one or more of the conductors electrically connect one of the leads to one of the contacts. Preferably, the means for compressing also comprises means for adjusting the probe adapter to fit a plurality of electronic devices of different sizes. Preferably, the means for compressing comprises a pair of jaws, each jaw supporting a plurality of the contacts and a connecting member, and means for urging the jaws toward each other. Preferably, the means for urging the jaws toward each other comprises a screw; alternatively it comprises a ratchet mechanism. Preferably the non-conducting support means comprises an elastomer, and the conductors comprise wires embedded in the elastomer. Preferably, the contacts have the same pitch as the leads on the electronic device. Preferably the probe connection means comprises a flex circuit, and the contacts comprise exposed traces on the flex circuit. Preferably, the means for compressing comprises means for causing the conductors to connect a plurality of the contacts to a plurality of the leads, with each of the leads being connected to a single one of the contacts. Preferably, the probe adapter further includes means for aligning the contacts with the leads as the means for compressing compresses the connecting member.

In another aspect the invention provides an adapter for making an electrical connection to the leads of an electronic device, the adapter comprising: a flex circuit having a plurality of traces, a portion of each of the traces exposed to form a contact, the contacts having the same pitch as the leads; means for connecting one or more of the leads to one or more of the contacts; and means for aligning the contacts with the leads as the means for connecting connects the contacts and leads so that each of the connected leads connects to a single one of the contacts. Preferably, the means for connecting comprises an elastomer having a plurality of wires embedded in it. Preferably, the means for connecting further comprises means for compressing the elastomer between the contacts and the leads. Preferably, the means for aligning comprises a tooth adapted to slide into the gaps between the leads.

In a further aspect the invention provides a probe adapter for making an electrical connection between an electronic probe and leads of an electronic device, the probe adapter comprising: probe connection means comprising a plurality of contacts and means for connecting the contacts to the probe; means for simultaneously connecting the contacts to the leads; and means for adjusting the probe adapter to fit a plurality of electronic devices of different sizes.

The invention not only provides a probe adapter that easily adjusts to almost any fine pitch surface mount device but also results in a probe adapter that is more economical to manufacture than conventional specialized probe adapters. Numerous other features, objects and advantages of the invention will become apparent from the following description when read in conjunction with the accompanying drawings.

DESCRIPTION OF THE PREFERRED EMBODIMENT

1. Overview

Figure 1:
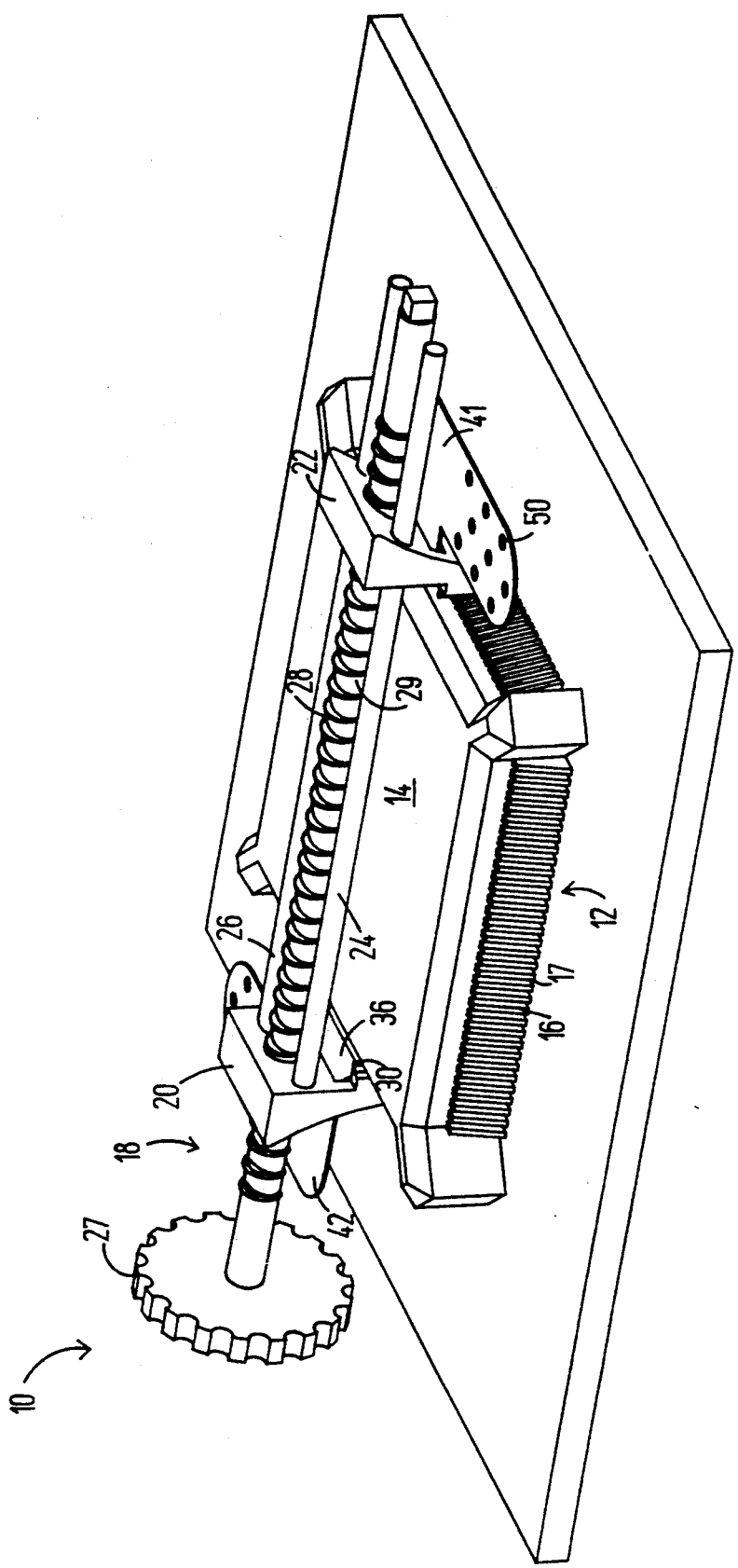
FIG. 1 is a perspective view of the preferred embodiment of a probe adapter according to the invention attached to a typical surface mount integrated circuit chip.
Figure 6:
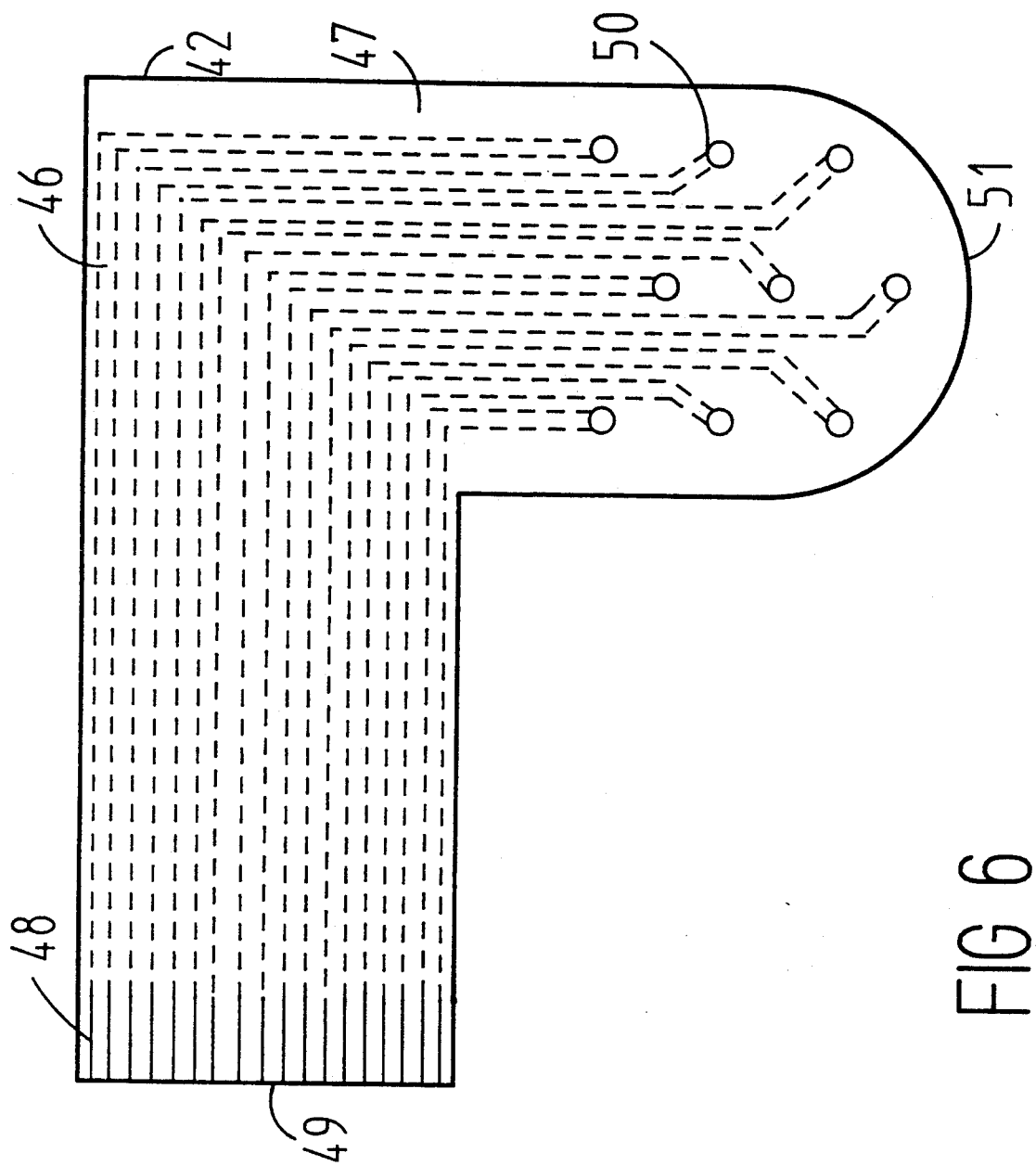
FIG. 6 is a plan view of the flex circuit of the adapter of FIG. 1.

A perspective view of the preferred embodiment of a probe adapter 10 according to the invention is shown in FIG. 1 attached to a typical surface mount integrated circuit chip 12. It should be understood that the particular embodiments of the invention described herein are exemplary, and are described in detail to more clearly and fully depict the invention than would otherwise be possible they are not meant to limit the invention to these particular embodiments. The integrated circuit chip 12 includes a chip body 14 and numerous leads 16 having a fine pitch, i.e., the distance from the edge of one lead to the same edge of the next lead is very small. The probe adapter 10 includes a vise-like assembly 18 which includes jaw members 20 and 22, guide rails 24 and 26 on which the jaws slide, and a screw 28 which draws the jaws 20 and 22 together. Teeth 30 and 32 (FIG. 3) on the each of the jaws 20, 22 slip in between the leads 16 of integrated circuit device 12 to align the jaws with the leads and to provide stability. A connector member 36 comprising an elastomer 39 (FIG. 4) in which fine wires 40 are embedded fits into a pocket 34 in jaw member 20 between the teeth 30 and 32. A flex tape 42 passes through a slot 44 in jaw member 20 and folds down behind connecting member 36. The flex tape 42 has conductive traces 46 (FIG. 6) which are exposed at one end 48 and connected to through-hole connectors 50. When the screw 28 (FIG. 1) is tightened, jaws 20 and 22 are urged toward each other, urging teeth 30 and 32 into the gaps 17 between the leads 16, compressing the elastomer 39 in the connecting members 36, and causing the wires 40 to electrically connect the leads 16 and the exposed flex circuit contacts 48. Previously it was very difficult to connect to the fine leads 16, or else an expensive, specially made adapter had to be used. The invention provides a simple, relatively inexpensive way to make a positive, accurate connection between each lead 16 and a through-hole connector 50. A probe (not shown) can then be easily connected to the lead 16 by inserting a pin (not shown) attached to the probe lead (not shown) into the appropriate through-hole connector 50. Thus the user is not required to manually hold the probe onto the lead.

2. Detailed Description of the Probe Adapter

Figure 2:
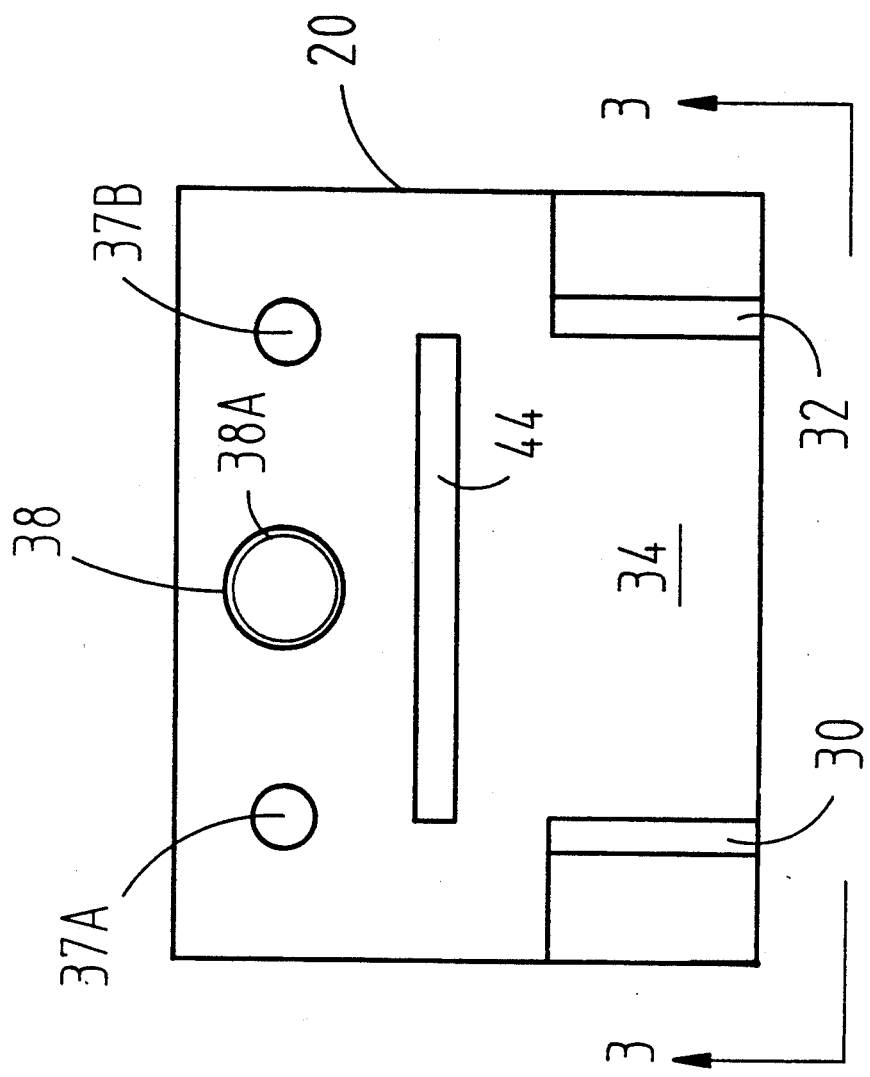
FIG. 2 is a plan view of a jaw member of the adapter of FIG. 1 as viewed from the side that grips the electronic device.
Figure 3:
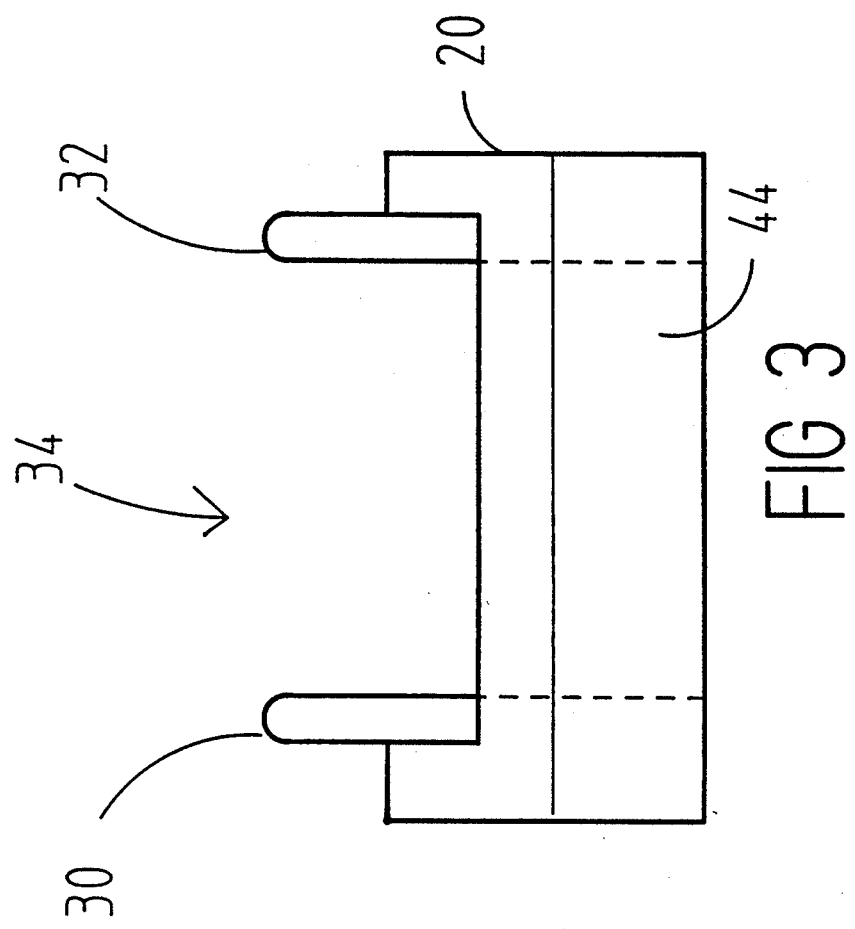
FIG. 3 is a bottom view of the jaw member of FIG. 2 as viewed in the direction indicated by the line 3—3 in FIG. 2.
Figure 4:
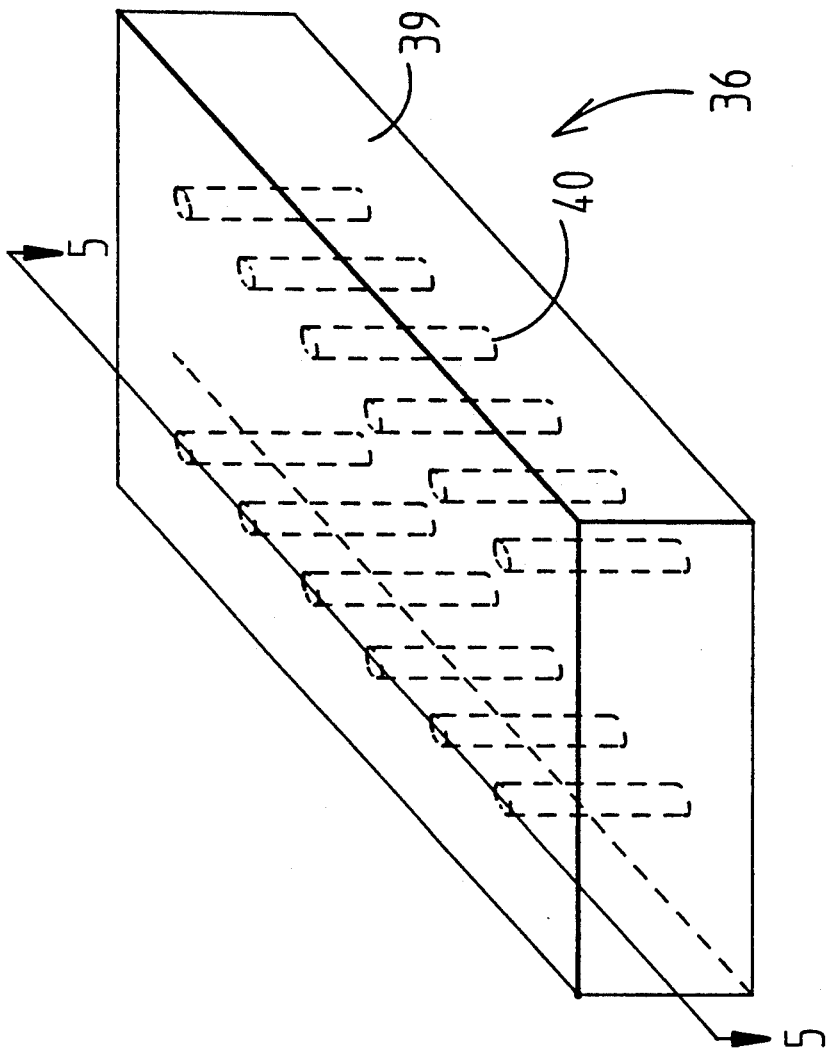
FIG. 4 is a perspective view of the preferred embodiment of the elastomer of the adapter of FIG. 1 showing the embedded wires.
Figure 5:
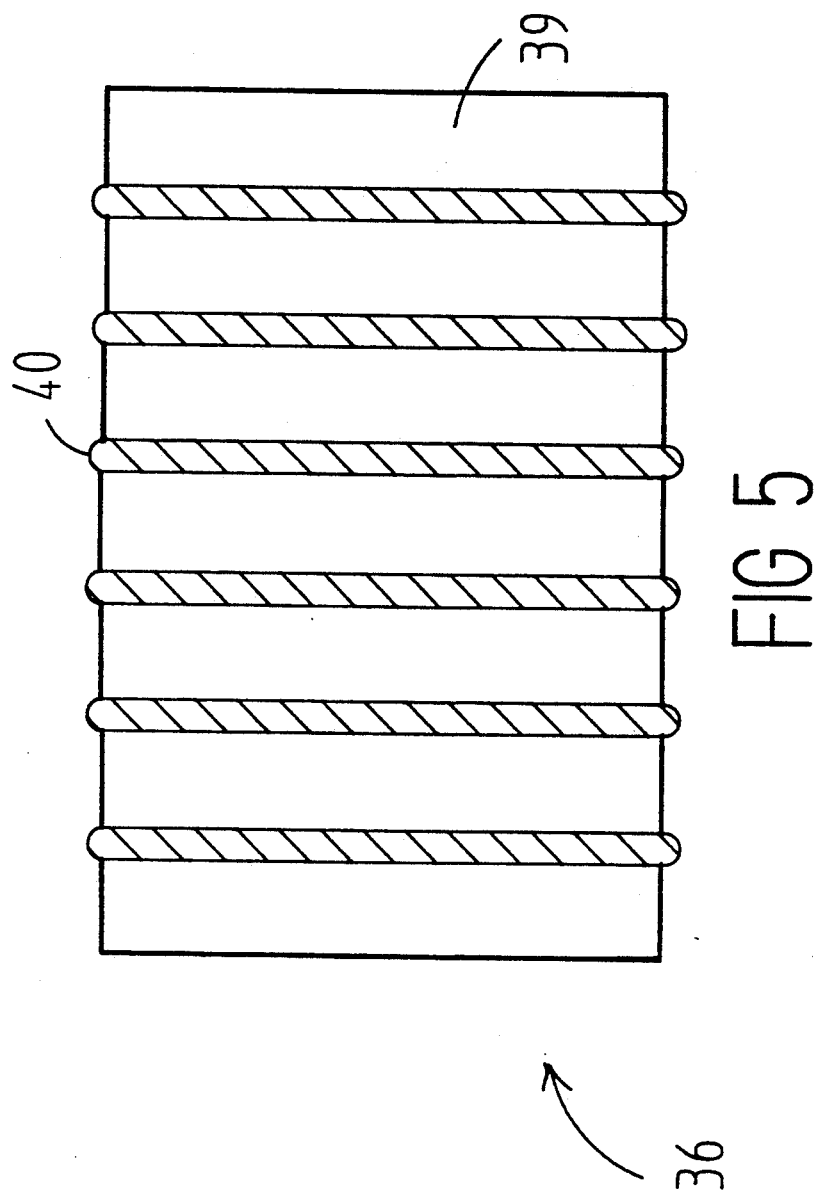
FIG. 5 is a cross-section of the elastomer of FIG. 4 taken through the line 5—5 of FIG. 4.

The preferred embodiment of the probe adapter 10 according to the invention is shown in FIG. 1. It includes a pair of identical jaw members 20 and 22, a pair of identical guide rails 24 and 26, a screw 28, a pair of identical flex circuit members 41 and 42, and a pair of identical connecting members, such as 36. The jaw member 20 is shown in FIGS. 2 and 3. It is a molded plastic part which includes a pair of teeth 30 and 32 having rounded distal ends, a rectangular pocket 34 formed between the teeth 30 and 32, a pair of circular openings 37A and 37B passing completely through jaw member 20 for receiving the rails 24 and 26, a threaded bore 38 passing through member 20 for receiving screw 28, and a slot 44 located between openings 37A and 37B and teeth 30 and 32 and passing through the jaw member 20 parallel to openings 37A and 37B. Threads 38A are preferably No. 0-80 threads. Teeth 30 and 32 are about 0.110 inches thick and protrude about 0.050 inches from the face of jaw member 20.

Rails 24 and 26 are about 0.040 inches in diameter and about 2.0 inches long and slidably fit in openings 37A and 37B without play. Screw 28 has a knurled handle 27 at one end and the other end is threaded for most of its length. The handle can be put on either end depending on which jaw 20, 22 it is screwed into first. This feature is useful when one end has space constraints. Screw 28 is preferably a size 0-80 screw about 2.1 inches long. Threads 29 are adapted to mesh with threads 38A in bore 38 of jaws 20 and 22.

A probe connection means 42 comprises a plurality of contacts 48 and means 50 for connecting the contacts to a probe. Preferably the probe connection means 46 is a Flex circuit 42 (FIGS. 6 and 7) comprising conductive traces 46 in a flexible plastic envelope 47. Flex circuit 42 preferably has an L-shape. On one end 49, the exposed contacts 48 are formed on one side of the plastic envelope 47. The other end 51 is rounded and has means 50 for connecting to the probe formed in it. Means 50 preferably comprises conductive through-holes, although it could just as well comprise pins or other appropriate connectors. Each through-hole 50 is connected to one of exposed contacts 48 via a trace 46. The flex circuit 42 is of a width and thickness that fits snugly in slot 44 in jaw member 20 and extends across the width of pocket 34. Preferably flex circuit 42 is about 0.900 inches wide at end 49 and about 0.005 inches thick. Traces 46, including the exposed contacts 48, are about 2 mils thick and about 0.025 inches wide. Preferably the pitch of the exposed contacts 48 is the same as the pitch of the leads 16 on the device 12 to be tested.

Connecting member 36 comprises an elastomer block 39 in which conductors 40 are embedded. The elastomer block is a non-conducting support means for supporting the conductors 40 aligned in a selected direction, which direction is substantially perpendicular to the contacts 48 and the leads 16. Block 39 is rectangular, preferably about 0.090 inches wide, by 0.900 inches long and 0.060 inches thick. Conductors 40 are preferably wires, each approximately 25 microns in diameter and 0.060 inches long. Wires 40 protrude about 15 microns from each side of elastomer block 39. The density of wires 40 in block 39 is about 2000 wires per square centimeter.

Figure 7:
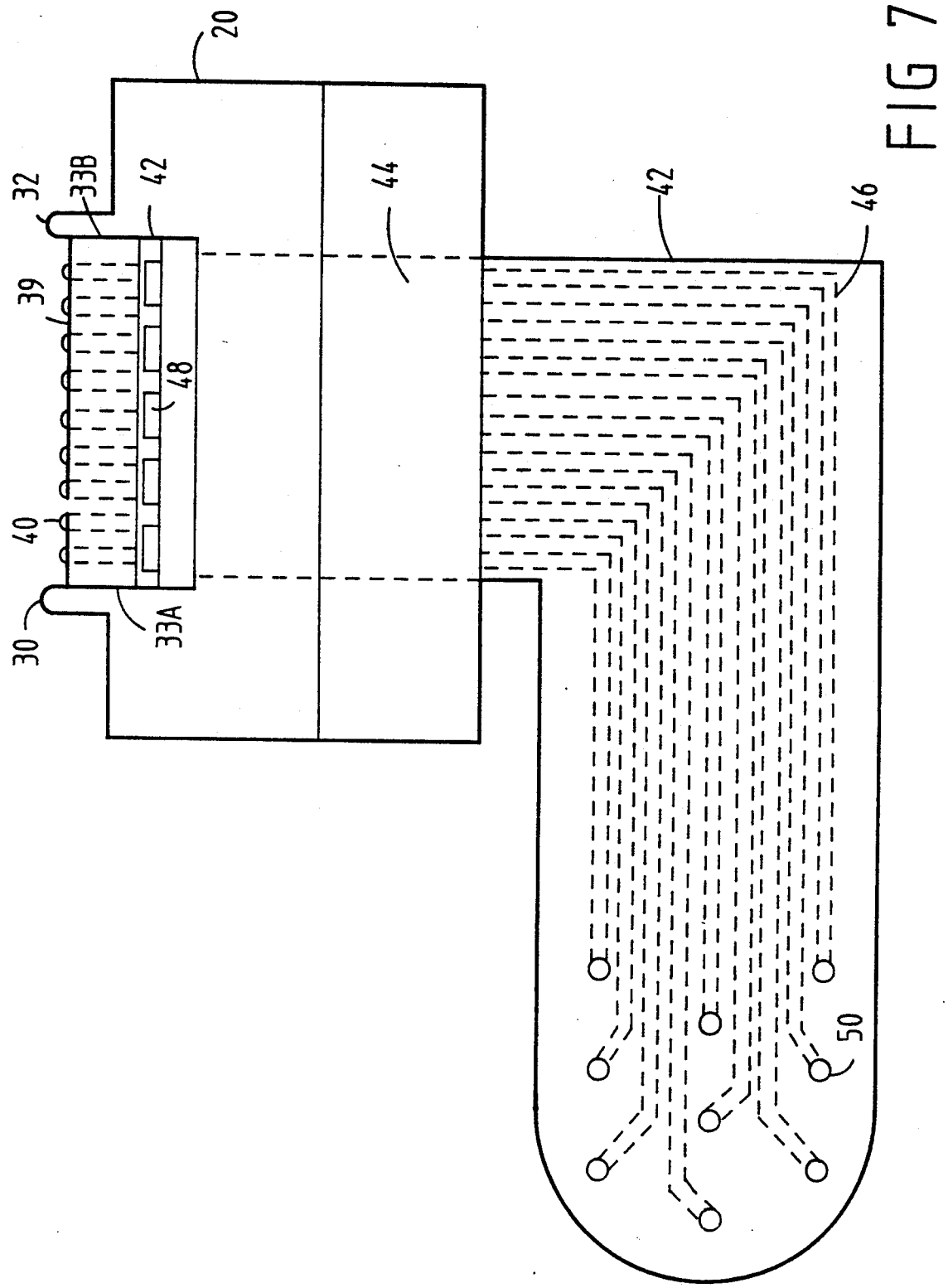
FIG. 7 is a the same view of jaw member as FIG. 3, with the flex circuit of FIG. 6 and the elastomer of FIG. 4 attached.

As shown in FIGS. 7 and 1, the adapter is assembled by passing end 49 of flex circuit 42 through slot 44 in a direction out of the paper in FIG. 2 and bending it down into the pocket 34 between teeth 30 and 32 so that the exposed contacts 48 face out of the paper in FIG. 2 and upwards in FIG. 3. The flex circuit 42 is glued in place, preferably with an insulative epoxy. As can best be seen in FIG. 7, epoxy is then applied to the ends 33A and 33B of connecting member 36, then member 36 is pressed into place in pocket 34 against contacts 48. An epoxy glue is applied to the ends of rails 24 and 26 that are to be inserted in jaw member 20 and the rails are inserted and the glue allowed to dry. The rails 24 and 26 are then passed though openings 37A and 37B in jaw member 22, then screw 28 is screwed through the bores 38 in each of jaw members 20 and 30, so that the jaws are slightly wider apart than the width of the integrated circuit chip to which adapter 10 is to be attached.

The jaw members 20 and 22 are preferably made of liquid crystal polymer plastic. The teeth 30 and 32 are preferably made of alumina ceramic and glued into place on the jaw member 20, 22 with epoxy. Flex circuit envelope 47 is preferably made of Kapton TM plastic, and the traces 46, including exposed contacts 48, and through-holes 50 are made of layers of copper, nickel, and gold. Rails 24 and 26 and screw 28 are preferably made of stainless steel. Elastomer block 39 is preferably made of silicon rubber. Wires 40 plated with gold or other non-corrosive conductive material. The elastomer block 39 with wires embedded may be purchased from Fujipoly, Inc., 750 Walnut Ave., Cranford, N.J. 07016.

Figure 8:
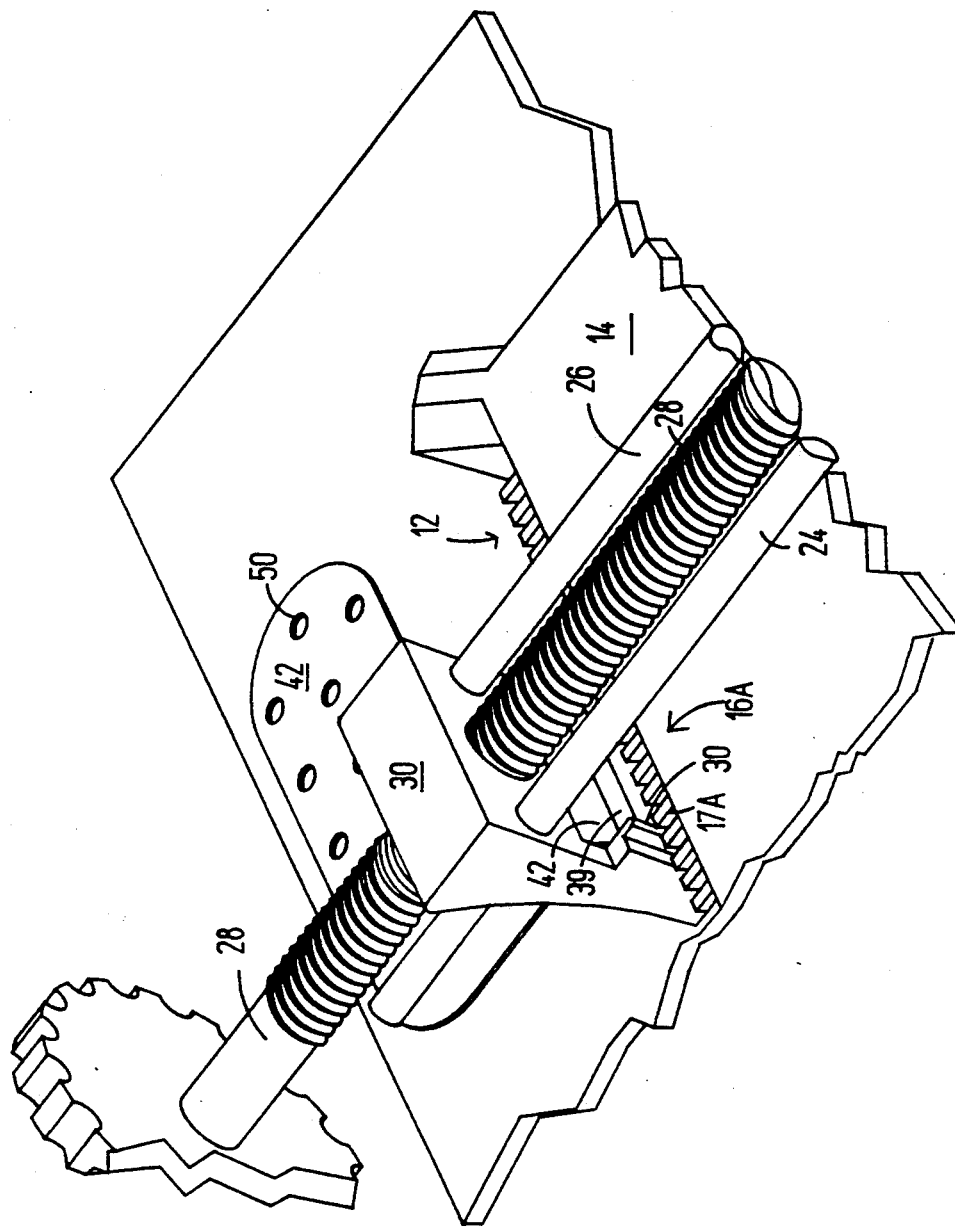
FIG. 8 is a close-up perspective view of the adapter and electronic device of FIG. 1 showing how the teeth and elastomer engage the leads of the electronic device.

The probe adapter according to the invention is operated as follows. First, screw 28 is adjusted so that jaws 20 and 22 are separated wider than the width of the electronic device 12 to be tested. As best seen in FIGS. 1 and 8, the jaws 20 and 22 are aligned over the leads 16A to be tested, with the teeth roughly in gaps, such as 17A, between the leads. The screw 28 is then turned to draw the jaws 20 and 22 together. The rounded ends of teeth 30 and 32 causes the jaws 20 and 22 to slip either one way or the other if the teeth 30 and 32 are not exactly in a gap, such as 17A. As the screw 28 is turned, teeth 30 and 32 are urged into the gaps between the leads, and the elastomer block 39 is compressed between the leads 16A and the flex circuit contacts 48. The elastomer block 39 is very compliant and deforms to the shape of the leads 16A as it is compressed. This causes the ends of wires 40 to be pressed against the leads 16A and the flex circuit contacts 48. When the adapter is clamped to the electronic device, a test instrument probe (not shown) may be connected to a selected one of the leads 16A by inserting a pin (not shown) connected to the probe input, via a probe lead or directly, into the one of through-holes 50 which is connected to the selected lead. The electronic signal will then pass from the integrated circuit lead 16A, to one of the flex circuit contacts 48 to which it is connected via wires 40, thence through the length of the flex circuit 42 via one of traces 46 to one of through-holes 50, through the pin (not shown) to the probe. The invention is particularly adapted so that probes having multiple probe tips can be connected simultaneously to multiple leads 16A by inserting the multiple probe tip pins into selected ones of the through-holes 50.

Figure 9:
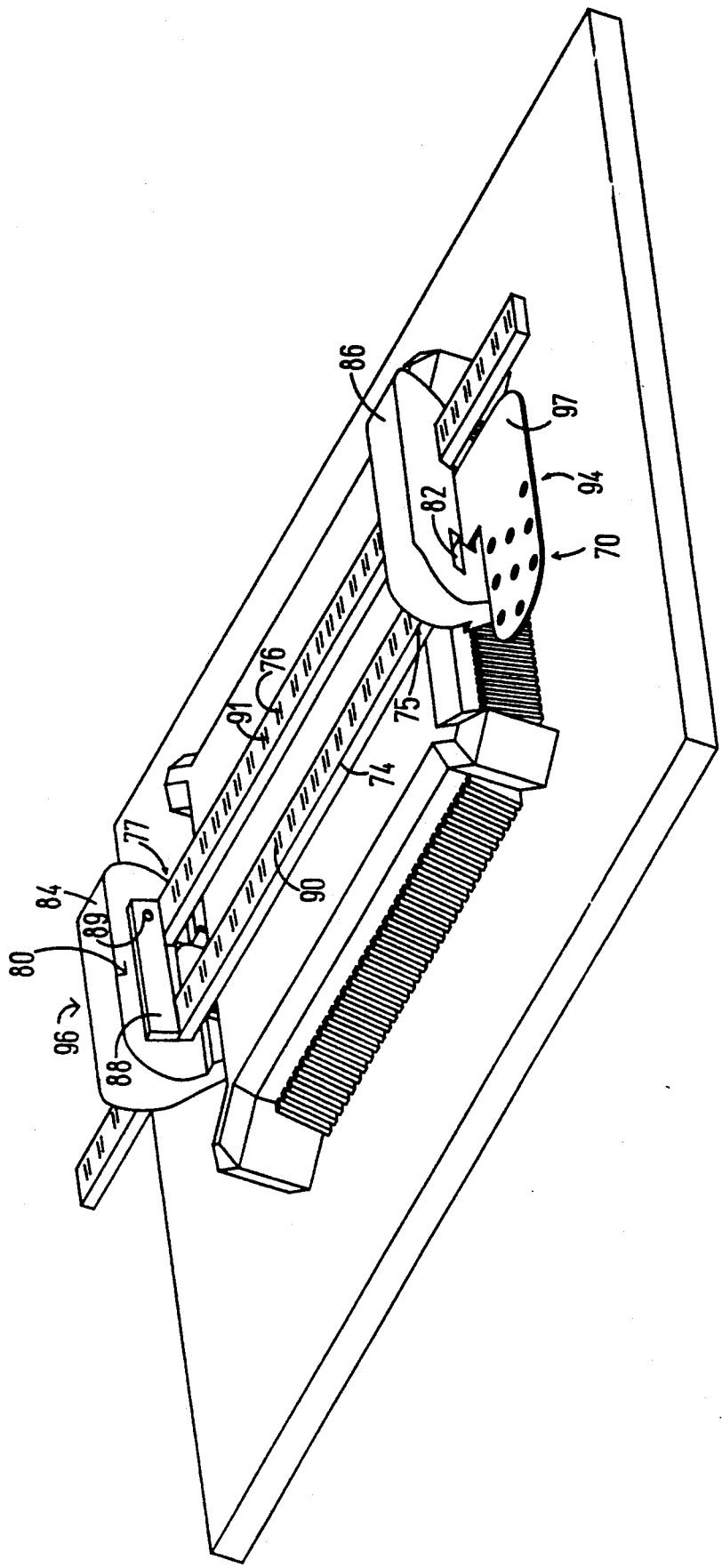
FIG. 9 is a perspective view of an alternative preferred embodiment of the adapter according to the invention attached to a surface mount integrated circuit chip.

An alternative preferred embodiment of a probe adapter 70 according to the invention is shown in FIG. 9. This embodiment is the same as the embodiment of FIGS. 1 through 8 except that rectangular rails 74 and 76 replace the cylindrical rails 24 and 26 and a ratchet mechanism 80 replaces screw 28 and threaded bores 38. Rectangular slots, such as 82, are formed in jaw members 84 and 86 rather than the circular holes 37A and 37B in the previous embodiment. Rails 74 and 76 are sized to slide in slots 82 without play. The end 75 of rail 74 is glued in slot 82 in jaw member 86, while the end 77 of rail 76 is glued in jaw member 84. Ratchet mechanism 80 comprises a ratchet bar 88 which pivots on pin 89 and ratchets on raised ratchet teeth 90 on rail 74. A similar mechanism may be located on jaw 86 which ratchets on the ratchet teeth 91 on bar 76. The structure of probe adapter 70 is thus completely symmetrical so that it may be made of a pair of identical parts 94 and 96 each comprising a jaw member, such as 86, a rail 74 such as 74, a flex circuit, such as 97 etc.

A feature of the invention is that so long as the pitch of the contacts 48 of flex circuit 42 is the same, or nearly the same, as the pitch of the leads 16 of the electronic component 12 to be tested, the wires 40 in the elastomer 39 automatically connect leads 16A to contacts 48, with each lead 16A being connected to a single one of contacts 48. Locating a lead to be tested and aligning the probe fixture so as to contact that particular lead is very difficult with prior art probe adapters. In the probe adapter according to the invention, the lead to be tested need only be roughly located, and it is easy to place the width of the adapter so it is sure to include the desired lead. The rest is automatic. Connection is made accurately and reliably with no possibility of shorts. Flex circuits are standard electrical parts that are much more easily obtained in a wide variety of pitches than specialized probe adapters; moreover flex circuits are readily manufacturable in any electronic lab that has the ability to lay down traces.

Another feature of the invention is that it works with any width of fine pitch surface mount chip package. Jaws 20 and 22 or 84 and 86 slide on rails 24 and 26 or 74 and 76, respectively, which provides infinite variability in the width of the package to be tested.

Yet another feature of the invention is that it requires no manual alignment or fixturing to attach it to the integrated circuit device 12. The teeth 30 and 32 self-align in the gaps 17 between the leads 16. The jaws 20, 22 stay parallel as they slide on rails 24, 26. This keeps the connecting members 36 at precisely the correct orientation for contacting the fine pitch leads 16. Once the probe adapter is clamped to the electronic component under test, multiple leads can be probed without touching the adapter.

A further feature of the invention is its simplicity. The single molded plastic piece part 20, 22 or 84, 86 houses the flex circuit 42 and connecting member 36 and also serves as the framework of the clamping mechanism. The metal guide rails keep the end pieces from rotating with respect to each other and provide mechanical stiffness to the device. All parts are made from standard low-cost materials, and the probe adapter is simple to assemble. The entire assembly is less expensive than a single package-specific fine pitch surface mount probe adapter.

There has been described a novel probe adapter that is adjustable to almost any integrated circuit component to be tested, is simple, and has many other advantages. It should be understood that the particular embodiments shown in the drawings and described within this specification are for purposes of example and should not be construed to limit the invention, which will be described in the claims below. Further, it is evident that those skilled in the art may now make numerous uses and modifications of the specific embodiments described, without departing from the inventive concepts. For example, now that the advantages of the wire-filled elastomer in making a probe adapter are seen, it is evident that this principal can be applied to many other probe adapter configurations. For example, it is clear that the embodiment of FIGS. 1 through 8 could be made completely symmetrical as is the embodiment of FIG. 9. In this embodiment, the one of rails 24 and 26 that extends toward handle 27 may run into the handle if chip 12 is very small. In this case handle 27 may be replaced with a slot (not shown) on one end of screw 28, so that screw 28 can be turned with a screw driver. As another example, only one tooth 30 could be used, or more than two. Other self-alignment mechanisms may be used. Pins or other connectors may be used instead of through-holes 50. The invention may also be applied to other types of electronic components than that described. Or equivalent electrical or mechanical components can be substituted for the various components and circuits described. Additional features may be added. A greater or lesser number of parts may be used. Consequently, the invention is to be construed as embracing each and every novel feature and novel combination of features present in and/or possessed by the probe adapter described.

What is claimed is:

1. A probe adapter for making electrical connection between an electronic probe and leads of a fine pitch surface mount electronic device, said probe adapter comprising:

a flexible circuit having a plurality of conductive traces formed thereon, wherein portions of said conductive traces are exposed to provide a plurality of contacts at one end of said flexible circuit and said conductive traces are patterned to provide means for electrically connecting at another end of said flexible circuit, said flexible circuit having at least one fold between said plurality of contacts and said means for electrically connecting;

an electrical connecting member comprising a plurality of conductors and an elastomer block, wherein said plurality of conductors are embedded in said elastomer block and said plurality of conductors are aligned substantially perpendicular to the plurality of contacts on the flexible circuit and the leads on the electronic device;

means for compressing said connecting member between said plurality of contacts and said leads so that more than one of said plurality of conductors electrically connect one of said leads to one of said plurality of contacts wherein said means for compressing comprises a pair of jaws, each jaw supporting a plurality of said contacts and said electrical connecting member, and means for urging said jaws toward each other and wherein said means for compressing also comprises means for adjusting said probe adapter to fit a number of possible physical sizes of said electronic device.

2. The probe adapter as in claim 1 wherein said means for urging said jaws toward each other comprises a screw.

3. The probe adapter as in claim 1 wherein said means for urging said jaws toward each other comprises a ratchet mechanism.

4. The probe adapter as in claim 1 wherein said contacts have a similar pitch as a pitch of the leads on said fine pitch surface mount electronic device.

5. The probe adapter as in claim 1 wherein said means for electrically connecting comprises a plurality of terminals, each terminal connected to one of said conductive traces.

6. The probe adapter as in claim 5 wherein said terminals comprise conductive through-holes in said flex circuit.

7. The probe adapter as in claim 1 wherein said means for compressing means for causing said conductors to electrically connect to a plurality of said contacts to a plurality of said leads, with each of said leads being electrically connected to a single one of said contacts.

8. The probe adapter as in claim 1 and further including means for aligning said contacts with said leads as said means for compressing compresses said electrical connecting member.

9. An adapter for making an electrical connection to leads of an electronic device, said leads being positioned at a predetermined pitch, said adapter comprising:
- a flex circuit having a plurality of traces, a portion of each of said plurality of traces is exposed to form a contact, said contacts having a pitch substantially similar to the predetermined pitch of said leads;
- means for electrically connecting one or more of said leads to one or more of said contacts, wherein said means for electrically connecting comprises an elastomer block having a plurality of conductors embedded in therein; and
- means for aligning said contacts with said leads as said means for electrically connecting connects said contacts and leads so that each of said leads is electrically connected to a single one of said contacts by more than one of said conductors, wherein said means for aligning comprises a pair of teeth having ends adapted to slide into the gaps between said leads.

10. The adapter as in claim 9 wherein said means for electrically connecting further comprises means for compressing said elastomer block between said contacts and said leads.

11. An adapter for making an electrical connection to leads of an electronic device, said leads being positioned at a predetermined pitch, said adapter comprising:
- a flex circuit having a plurality of traces, a portion of each of said plurality of traces exposed to form a contact, said contacts having a pitch substantially similar to the predetermined pitch of said leads;
- means for electrically connecting one or more of said leads to one or more of said contacts, wherein said electrically connecting means comprises an elastomer block having a plurality of conductors embedded in therein; and
- means located on first and second ends of said electrically connecting means for aligning said contacts with said leads as said means for electrically connecting connects said contacts and leads so that each of said leads electrically connects to a single one of said contacts, wherein said means for aligning comprises a pair of teeth having rounded distal ends adapted to slide into the gaps between said leads.

12. The adaptor as in claim 11 wherein the pair of teeth are made of ceramic.

13. A probe adapter for making an electrical connection between an electronic probe and leads of an electronic device, said probe adapter comprising:
- probe connection means comprising a plurality of contacts and means for connecting said contacts to said probe;
- means for simultaneously connecting said contacts to said leads including an elastomer block having a plurality of conductors embedded therein;
- means for compressing including a pair of jaws, each jaw supporting a plurality of said contacts and said means for simultaneously connecting;
- means attached to said pair of jaws for adjusting said probe adapter to fit a plurality of electronic devices of different sizes, wherein said means for adjusting includes means for urging said jaws toward each other.

* * * * *